United States Patent
Wang et al.

(10) Patent No.: US 7,205,186 B2
(45) Date of Patent: Apr. 17, 2007

(54) SYSTEM AND METHOD FOR SUPPRESSING OXIDE FORMATION

(75) Inventors: Chih-Hao Wang, Hsin-Chu (TW); Shang-Chih Chen, Jiadong Township, Pingtung County (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 11/025,040

(22) Filed: Dec. 29, 2004

(65) Prior Publication Data
US 2006/0141729 A1 Jun. 29, 2006

(51) Int. Cl.
*H01L 21/336* (2006.01)
*H01L 21/8234* (2006.01)

(52) U.S. Cl. ............... 438/197; 438/381; 438/954; 438/680; 257/E21.051; 257/E21.057; 257/E21.17

(58) Field of Classification Search ............... 438/381, 438/197, 311, 663, 680, 681, 766, 768, 773, 438/775, 769, 954
See application file for complete search history.

(56) References Cited

U.S. PATENT DOCUMENTS

| | | | | |
|---|---|---|---|---|
| 6,051,865 A | * | 4/2000 | Gardner et al. | 257/411 |
| 6,476,454 B2 | * | 11/2002 | Suguro | 257/410 |
| 6,864,145 B2 | * | 3/2005 | Hareland et al. | 438/302 |
| 7,002,224 B2 | * | 2/2006 | Li | 257/405 |

* cited by examiner

*Primary Examiner*—David Nhu
(74) *Attorney, Agent, or Firm*—Haynes and Boone, LLP

(57) ABSTRACT

A system and method for suppressing sub-oxide formation during the manufacturing of semiconductor devices (such as MOSFET transistor) with high-k gate dielectric is disclosed. In one example, the MOSFET transistor includes a gate structure including a high-k gate dielectric and a gate electrode. In this example, the gate structure is covered with a nitride layer that is used to prevent oxygen from entering the structure during processing, yet is sufficiently thin to be effectively transparent to the processing.

17 Claims, 2 Drawing Sheets

SYSTEM AND METHOD FOR SUPPRESSING OXIDE FORMATION

BACKGROUND

The semiconductor integrated circuit (IC) industry has experienced rapid growth. Technological advances in IC materials and design have produced generations of ICs where each generation has smaller and more complex circuits than those from the previous generation. However, those advances have increased the complexity of processing and manufacturing ICs and, for those advances to be realized, similar developments in IC processing and manufacturing are necessary. For example, an IC is formed by creating one or more devices (e.g., circuit components) on a substrate using a fabrication process. As the geometry of such devices is reduced to the submicron or deep submicron level, the IC's active device density (i.e., the number of devices per IC area) and functional density (i.e., the number of interconnected devices per IC area) have become limited by the fabrication process.

In one example, during the manufacturing processes, oxygen may enter into the metal-oxide high-k gate dielectric residing at the edge of a gate electrode, and diffuse laterally toward the center of the electrode creating an undesirable amorphous or sub-oxide formation in the interface of metal-oxide high-k gate dielectric and gate electrode. Such a formation adversely affects the performance of the device, such as the equivalent oxide thickness (EOT) in a device formed with a high-k dielectric layer (e.g., having a higher dielectric constant than 3.8; in another example, having a higher dielectric constant than 8.). For example, the oxidation layer may cause an increase of EOT and/or non-uniform EOT to degrade device driving current.

Previously available methods for eliminating such a sub-oxide formation include utilizing nitride seals or barriers, often in combination with an oxygen-nitrogen-oxygen (ONO) spacer. However, such approaches possess a number of shortcomings. For example, if a relatively thick (e.g., greater than 60 Å) nitride seal is formed before source/drain extension or lightly-doped drain (LDD) implant procedures and/or rapid thermal anneal (RTA), the implant and RTA procedures must be modified to accommodate the existence of the nitride seal. Also, an additional etching process may be required to remove the nitride film over the source and drain regions. If the nitride seal is formed after implant and RTA, sub-oxide formation may occur during RTA process before the seal is formed.

Accordingly, it is desirable to provide an improved system and method for suppressing oxidation during the manufacturing of semiconductor devices.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
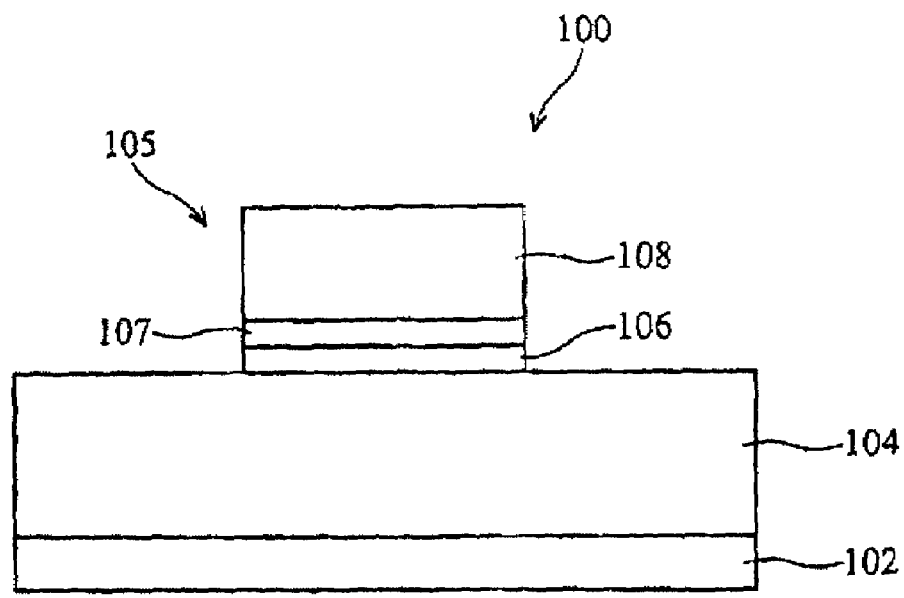
FIG. 1 illustrates an exemplary cross-sectional view of a partial semiconductor device.

The present disclosure relates generally to the manufacturing of semiconductor devices, and more particularly to a system and method of suppressing sub-oxide formation during the manufacturing of semiconductor devices with high-k gate dielectric.

It is to be understood that the following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purposes of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring now to FIG. 1, shown therein is an exemplary cross-sectional view of a partial semiconductor device 100. In this embodiment, the semiconductor device 100 may include one or more of the following: a dynamic random access memory (DRAM) (including but not limited to a stack-type DRAM and/or a trench-type DRAM), a static random access memory (SRAM), a non-volatile memory, a flash memory, other memory devices, a metal-oxide semiconductor field-effect transistor (MOSFET), and/or other logic devices. In one example, the MOSFET may have a channel in <110> crystalline direction for general device application or a channel in <100> crystalline direction to further enhance device and circuit performance. In another example, at least one of the logic devices may have an electrically conductive gate electrode that includes metal, metal nitride, metal alloy, a metal compound, and/or other materials.

The formation of the semiconductor device 100 may commence with a substrate 102. The substrate 102 may include silicon, silicon-on-insulator (SOI), silicon with defective crystalline, Si, Ge, SiGe, strained Si, strained SiGe, GeOI, SiGeOI, diamond, and/or other suitable materials. The substrate 102 may be n-type doped or p-type doped, and is n-type doped in the present example for purposes of illustration. The substrate 102 may be provided with one or more isolation features (not shown). The isolation features may include local oxidation of silicon (LOCOS) structures and/or shallow trench isolation (STI) structures that are formed in the substrate 102 to electrically isolate device areas.

In this example, a well region 104 may be formed in the substrate 102 by ion implantation (although use of a p-type doped substrate may negate the need for a well region). For example, the well region 104 may be formed by growing a sacrificial oxide layer on the substrate 102, opening a pattern for the location of the well, and then using a chained-implantation procedure. It is understood that the substrate 102 may have a p-type doped well, n-type doped well, and/or a combination thereof. While not being limited to any particular dopant type or scheme, in one embodiment, the well region 104 may employ at least one p-type dopant or at least one n-type dopant.

A gate structure 105 can then be formed over the substrate 102 and well region 104. In the present embodiment, the gate structure 105 includes an insulating layer 106 (which is optional), a high-k gate dielectric layer 107, and a gate conductor/electrode 108. It is understood that different gate structures can also benefit from the present invention. For example, multiple high-k gate dielectric layers 107 also can be used, insulating layer 106 can be missing, and so forth.

In furtherance of the example, the insulating layer 106 may be deposited or formed over the substrate 102. The insulating layer 106 may include a variety of materials, including but not limited to, silicon dioxide ($SiO_2$), silicon nitride (SiN), silicon oxynitride (SiON), SiC, CN, and SiOC. Formation of the insulating layer 106 may include thermally oxidizing the substrate 102 to form thermal silicon oxide, then nitridizing the thermal silicon oxide in nitrogen ambient or by plasma nitridation to form silicon oxynitride. In some embodiments, no insulating layer may exist.

In furtherance of the example, the high-k gate dielectric 107 may be deposited on or over the insulating layer 106 and/or the substrate 102. The high-k gate dielectric 107 may include a high-k dielectric material, such as $HfO_2$, $ZrO_2$, $Al_2O_3$, $TiO_2$, $Ta_2O_5$, $La_2O_3$, $CeO_2$, $Bi_4Si_2O_{12}$, $WO_3$, $Y_2O_3$, $Ba_{1-x}Sr_xTiO_3$, $LaAlO_3$, $PbTiO_3$, $BaTiO_3$, $SrTiO_3$, $PbZrO_3$, PST, PZN, PZT, PMN, metal-oxide, metal-silicate, metal-nitride, transition metal-oxide, transition metal-silicate, transition metal-nitride, hafnium silicon ($HfSi_x$), hafnium oxide ($HfO_x$), hafnium silicon oxide (HfSiOx), hafnium silicon oxynitride ($HfSi_xON_y$), hafnium silicon nitride ($HfSi_xN_y$), hafnium aluminum oxide ($HfAlO_x$), the combination of at least two of these materials, and/or other suitable materials. The high-k gate dielectric 107 may be formed by atomic layer deposition (ALD), metal organic chemical vapor deposition (MOCVD), sputtering, low pressure chemical vapor deposition (LPCVD), plasma enhanced chemical vapor deposition (PECVD), evaporation, and/or other methods. Generally, the dielectric constant k of the gate dielectric 107 may be at least 8. However, other k figures are also contemplated for the gate dielectric 107. In one example, gate dielectric materials, such as hafnium oxide, may be blanket deposited on or over the insulating layer 106 to form the high-k gate dielectric 107. In another example, gate dielectric materials may be selectively deposited. In a third example, it may be desirable to blanket deposit some materials, such as hafnium oxide, in some fabrication processes, while selectively depositing the same materials in other processes.

In furtherance of the example, the gate dielectric 107 may be formed by ALD, which provides good step coverage (even on large areas), and a dense and pinhole free structure. ALD may be particularly useful for the deposition of metals and metal oxides in high packing density and/or high aspect ratio applications that include relatively demanding thin film requirements. In ALD, films grow with a relatively constant growth rate, and each deposition cycle ideally produces one molecular layer of the deposited material on the substrate surface. However, in reality, the growth rate is below one molecular layer per cycle because the absorbed source chemical molecules may be bulky or the substrate temperature may affect the number of active sites (e.g., —OH groups) on the substrate surface. Metal oxide thin films produced by ALD are generally uniform and have desirable adhesion properties that allow them to become firmly bonded to the substrate surface.

In this example, the ALD of a high-k material, such as $HfO_2$, may be achieved by co-reacting a precursor in the presence of a gas, and then purging the precursor using the same gas. For $HfO_2$, ALD may utilize a precursor of Hf, such as $HfCl_4$, or other organ metallic Hf sources having a variety of ligands attached to the Hf atom. For example, appropriate precursors may include $HfCl_4$ or $Hf(OR)_4$, wherein R is an alkyl such as $CH(CH_3)_2$; $Hf(tmdh)_4$, wherein tmdh=2,2,6,6-tetramethyl-3,5-heptanedionato; $Hf(tfac)_4$, wherein tfac=trifluoroacetylacetonate; or $Hf(NO_3)_4$. Similar precursors may be used for the ALD of other high-k materials, such as $ZrO_2$. Because carbon containing hafnium precursors may result in excessive carbon and fluorine incorporation in the metal oxide film, $HfCl_4$ may be a desirable choice, as it may result in limited residual chlorine incorporation. $HfCl_4$ may also be a desirable metal oxide precursor, because it may be sublimated by injection and vaporization into the process reactor.

In furtherance of the example, $H_2O$ vapor may be selected as an oxygen source for the $HfO_2$. In the present example, a $HfO_2$ deposition process may be accomplished at a temperature ranging between about 200° C. and about 400° C., and with a deposited film thickness ranging between about 3 Angstroms and about 75 Angstroms. The ALD process may be performed in cycles with a series of $HfO_2$ monolayers formed during each cycle, until the desired film thickness is achieved for the high-k gate dielectric 107.

Figure 2:
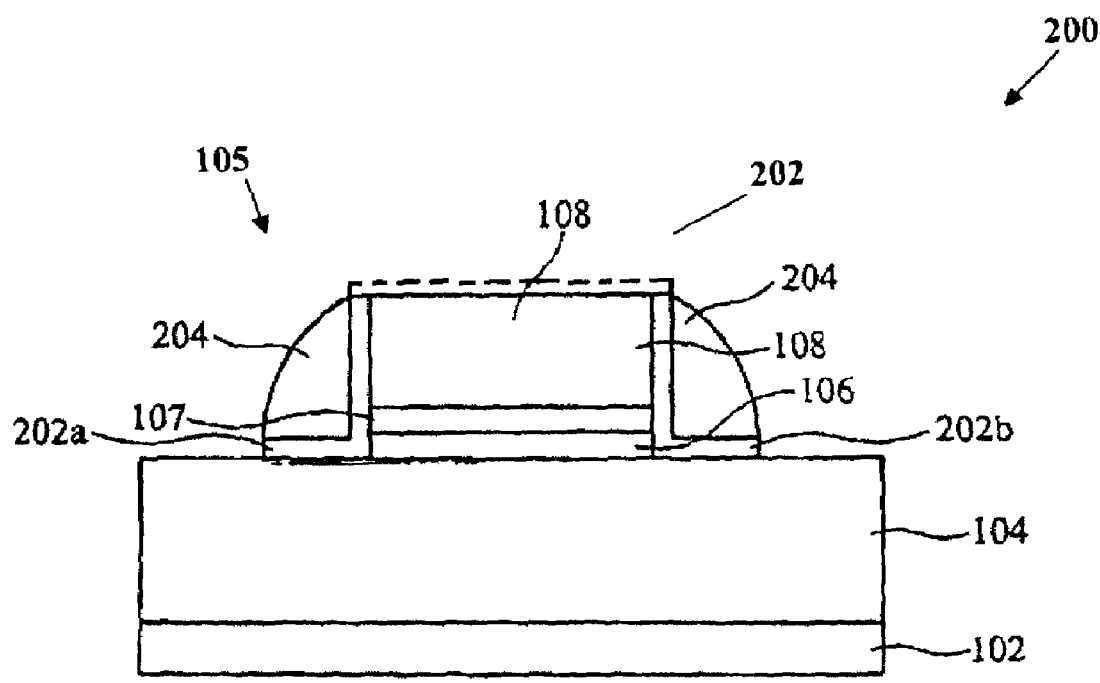
FIG. 2 illustrates an exemplary cross-sectional view of a partial semiconductor device that includes a layer for suppressing sub-oxide formation.

In furtherance of the example, the gate electrode 108 is deposited on or over the high-k gate dielectric 107. The gate electrode 108 may include polycrystalline silicon, Cu, Al, Ni, Co, W, metal suicide, tungsten, silicide, combination of at least two of these materials, or other suitable materials. The gate electrode 108 may be formed through a variety of methods, such as CVD, plasma vapor deposition (PVD), ALD, or other suitable methods. In one example, a layer of polysilicon may be created at approximately between 400° C. to 800° C. and then the gate electrode 108 formed therefrom. However, other temperatures are also contemplated for forming the gate electrode 108. Referring now to FIG. 2, shown therein is an exemplary cross-sectional view of a further developed partial semiconductor device 200. In one embodiment, a nitrogenized layer 202 (shown partially in phantom) may be formed to block oxygen diffusion into the gate structure 105, which in the present example includes the dielectric 107 and the gate electrode 108. The nitrogenized layer 202 may be formed by nitridation, such as by a nitrogen-contained gas treatment (for example, $NH_3$ nitridation), a nitrogen-contained plasma process (for example, plasma nitridation), decoupled nitrogen plasma (DNP), and any other suitable processes. As will be described below, a portion of the nitrogenized layer 202 extending across a top surface of the gate electrode 108 is etched away in subsequent processing steps.

The nitrogenized layer 202 may also or alternatively include a nitrogen-contained film, such as $Si_xN_y$. The thin nitride film 202 may be formed by molecular beam epitaxy (MBE), ALD, and any other suitable methods, and may function as a channel-effect screening layer.

In a preferred embodiment, the layer 202 may be relatively thin, e.g., no more than about 30 Angstroms in thickness. It is further contemplated that the layer 202 may extend to the left and/or right edge of the substrate 102. It is understood that the thickness of the layer 202 is determined by one or more of the properties discussed below, as desired, and that thicknesses greater than 30 Angstroms can be used.

By being thin, the layer 202 has several advantages. For one, it can be applied prior to the implantation of dopants into the substrate 100 and/or any rapid thermal annealing (RTA) processes. Being so thin, the layer 202 is effectively "transparent", in that the implantation and RTA processes are not substantially affected by the existence layer. Also, the layer 202 can be easily removed during subsequent etching (such as spacer etching discussed below), so no additional processes are required for removal.

In furtherance of the example, sidewall spacers 204 may be formed pursuant to methods known in the art, such as blanket depositing and dry etching. The sidewall spacers 204 may include oxygen, nitrogen, high-k materials, composite materials, and/or other suitable materials. In a preferred embodiment, each of the sidewall spacers 204 comprise alternating layers of oxide and nitride, such as a NO, an ON or an ONO spacer. The sidewall spacers 204 can be shaped or formed using a dry etching process, which can further remove portions of the thin layer (designated in FIG. 2 as portions 202a and 202b).

Figure 3:
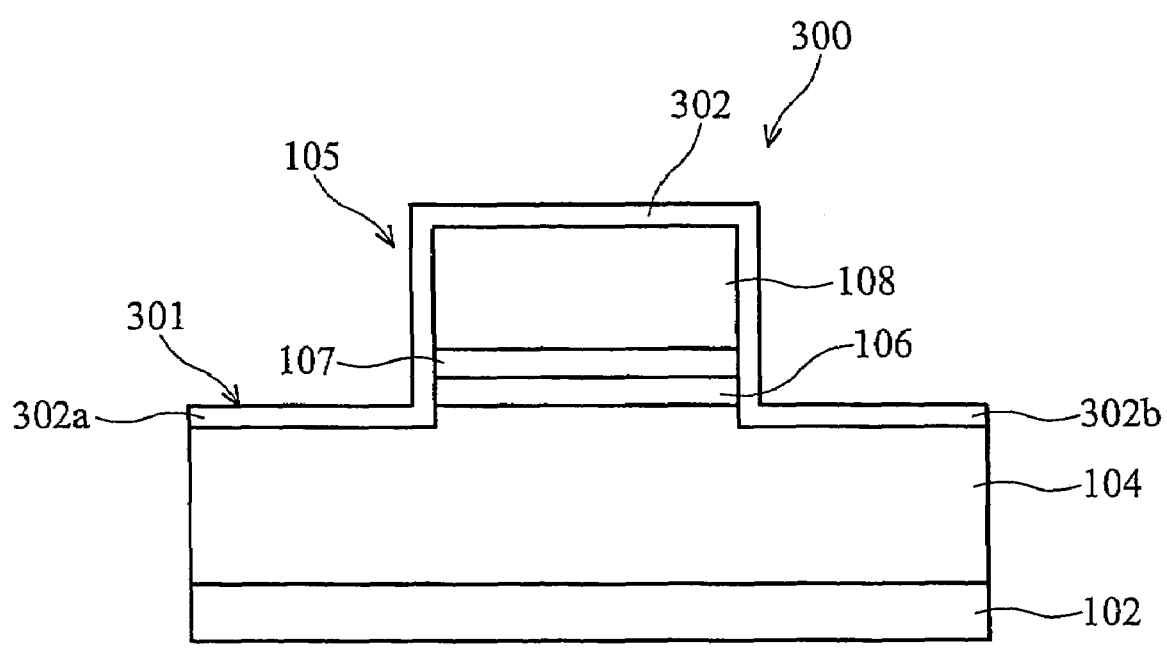
FIG. 3 illustrates another exemplary cross-sectional view of a partial semiconductor device that includes a layer for suppressing sub-oxide formation.

Referring now to FIG. 3, shown therein is another exemplary cross-sectional view of a partial semiconductor device 300. In this embodiment, prior to forming a layer 302 over the substrate 102 for suppressing oxidation, the surface of the substrate 102 may be etched by known methods, creating recess areas 301 with a thickness ranging between about 1 Angstrom to about 100 Angstroms. Following the etching, the layer 302 may be formed pursuant to procedures described above with respect to the layer 202. In this example, the recess areas 301 in the substrate 102 may be used to accommodate a portion of the layer (identified as layer portions 302a and 302b). Again, it is contemplated that the layer 302 may extend to the left and/or right edge of the gate structure.

Although only a few exemplary embodiments of this disclosure have been described in details above, those skilled in the art will readily appreciate that many modifications are possible in the exemplary embodiments without materially departing from the novel teachings and advantages of this disclosure. In one example, the layer 202 may be utilized for a dummy structure of a semiconductor device that contains at least one high-k device. Also, features illustrated and discussed above with respect to some embodiments can be combined with features illustrated and discussed above with respect to other embodiments. Accordingly, all such modifications are intended to be included within the scope of this disclosure.

What is claimed is:

1. A method for creating a semiconductor device, comprising:
    forming a gate structure over a substrate;
        forming a thin layer over sidewalls of the gate structure and over the substrate, the thin layer including a material for suppressing oxidation into the gate structure; and
        implanting dopants into the substrate through the thin layer.

2. The method of claim 1 further comprising:
    forming a spacer on a sidewall of the gate structure after implanting the dopants.

3. A method for creating a semiconductor device, comprising:
    forming a gate structure over a substrate;
    forming a thin layer over sidewalls of the gate structure and over the substrate, the thin layer including a material for suppressing oxidation into the gate structure;
    implanting dopants into the substrate through the thin layer; and
    forming a spacer on a sidewall of the gate structure after implanting the dopants,
    wherein the spacer is a nitride-oxide (NO), an oxide-nitride (ON), or an oxide-nitride-oxide spacer.

4. The method of claim 3 wherein the step of forming the spacer includes an etch process that removes a portion of the thin layer over the substrate.

5. The method of claim 1 further comprising:
    rapid thermal annealing (RTA) the substrate after implanting the dopants.

6. The method of claim 1 wherein the thin layer is less than or equal to 30 Angstroms in thickness.

7. The method of claim 1 wherein the thin layer is formed by a nitrogen-contained gas treatment.

8. The method of claim 1 wherein the thin layer is formed by a nitrogen-contained plasma process.

9. The method of claim 1 wherein the thin layer is formed by depositing a nitride film by molecular beam epitaxy (MBE).

10. The method of claim 1 wherein the thin layer is formed by depositing a nitride film by atomic layer deposition (ALD).

11. The method of claim 1 wherein the gate structure comprises a high-k material and a polysilicon material.

12. The method of claim 1 wherein the gate structure comprises a high-k material and a conductor material.

13. The method of claim 1 wherein the gate structure comprises an insulating layer and a polysilicon material.

14. A method of making a semiconductor device, comprising,
    forming and patterning a gate structure on a semiconductor substrate, the gate structure including a high-k dielectric and a conductor electrode;
    forming a nitride film over the gate structure and the semiconductor substrate, the nitride film being sufficiently thin to be effectively transparent to a subsequent substrate implantation procedure and being constructed in a manner to block oxygen from entering the gate structure during the subsequent substrate implantation procedure;
    implanting dopants into the substrate through the nitride film; and
    forming sidewall spacers on the gate structure and over the nitride film, wherein the formation of the sidewall spacers includes an etch process that not only shapes the sidewall spacers, but also removes at least a portion of the nitride film from over the implanted semiconductor substrate.

15. The semiconductor device of claim 14 wherein the nitride layer is formed by nitridation and is thinner than about 30 Angstroms.

16. The semiconductor device of claim 14 wherein the sidewall spacer is a nitride-oxide (NO), an oxide-nitride (ON), or an oxide-nitride-oxide (ONO) spacer.

17. The semiconductor device of claim 14 wherein the gate structure includes an insulating layer.

* * * * *